(12) United States Patent
Wong et al.

(10) Patent No.: US 7,667,992 B2
(45) Date of Patent: Feb. 23, 2010

(54) POWER SOURCE MODULE

(75) Inventors: Shih-Fang Wong, Taipei Hsien (TW);
Tsung-Jen Chuang, Taipei Hsien (TW);
Jun Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 271 days.

(21) Appl. No.: 11/769,727

(22) Filed: Jun. 28, 2007

(65) Prior Publication Data
US 2008/0158913 A1 Jul. 3, 2008

(30) Foreign Application Priority Data
Dec. 29, 2006 (CN) .................. 2006 1 0064601

(51) Int. Cl.
*H02M 1/00* (2007.01)
(52) U.S. Cl. ....................... 363/147; 363/41
(58) Field of Classification Search ............. 363/34–41, 363/16–20, 21.05, 21.08, 46, 147, 97, 131; 323/282–288, 222; 331/16, 34, 45, 76; 342/44, 342/50, 51, 359, 372
See application file for complete search history.

(56) References Cited

U.S. PATENT DOCUMENTS

| 6,775,164 | B2 * | 8/2004 | Wong et al. .................. 363/147 |
| 6,839,247 | B1 | 1/2005 | Yang et al. |
| 6,885,253 | B2 * | 4/2005 | Ahmed ......................... 331/45 |
| 6,903,536 | B2 | 6/2005 | Yang |

FOREIGN PATENT DOCUMENTS

| CN | 1452308 A | 10/2003 |
| CN | 2699576 Y | 5/2005 |
| CN | 1622748 A | 6/2005 |
| CN | 1633228 A | 6/2005 |
| CN | 1797919 A | 7/2006 |

* cited by examiner

*Primary Examiner*—Rajnikant B Patel
(74) *Attorney, Agent, or Firm*—Frank R. Niranjan

(57) ABSTRACT

A power source module is assembled on a main printed circuit board. The power source module comprises an input processing circuit, a PFC/PWM control circuit, a conversion circuit, and an output processing circuit. The input processing circuit is for rectifying an alternating current voltage to be a primary direct current voltage. The PFC/PWM control circuit is for modulating the primary direct current voltage. The PFC/PWM control circuit is assembled on a subsidiary printed circuit board electrically connected to the main printed circuit board. The conversion circuit is for converting the primary direct current voltage to be a secondary direct current voltage. The output processing circuit is for rectifying and filtering the secondary direct current voltage.

16 Claims, 6 Drawing Sheets

POWER SOURCE MODULE

BACKGROUND OF THE INVENTION

1. Field of the Invention

The present invention generally relates to power, and particularly to a power source module.

2. Description of Related Art

Power source modules are used to receive alternating current (AC) power from an AC power supply, and generate direct current (DC) power to power up electronic products. Referring to FIG. 6, a conventional power source module 100 connects an AC power supply 888 with a load 999. The power source module 100 includes an input processing circuit 102, a power switch 104, a converter 106, an output processing circuit 108, a comparator 110, a PWM (Pulse Width Modulation) control circuit 112, and a reference voltage circuit 114.

The input processing circuit 102 receives a first AC voltage from the AC power supply 888 and rectifies and filters the first AC voltage to obtain a first DC voltage. The first DC voltage is converted to a pulse voltage by the power switch 104. The pulse voltage is converted to a second AC voltage by the converter 106. The second AC voltage is rectified and filtered by the output processing circuit 108. The output processing circuit 108 generates a second DC voltage. The second DC voltage is sent to the load 999 and is fed back to the comparator 110. A reference voltage is sent to the comparator 110 from the reference voltage circuit 114. The second DC voltage is compared with the reference voltage by the comparator 110. A control signal is generated by the comparator, and is received by the PWM control circuit 112. The PWM control circuit 112 modulates an "on" duration of the power switch 104 based on the control signal to indirectly adjust the second DC power.

However, in practice, these components such as the power switch 104, the converter 106, the output processing circuit 108, and the comparator 110 are assembled on a printed circuit board (PCB) very closely to each other. Electro magnetic interference (EMI) occurs among these components. The EMI causes the second DC voltage, sent to the load 999, to be unstable. As a result, the load 999 cannot work normally and its lifetime will be shortened. Take a liquid crystal display as an example, when an unstable DC voltage is sent to the liquid crystal display, a distorted picture may be displayed.

Therefore, a power source module is needed in the industry to address the aforementioned deficiencies and inadequacies.

SUMMARY OF THE INVENTION

A power source module is assembled on a main printed circuit board. The power source module comprises an input processing circuit, a power factor correction/pulse width modulation (PFC/PWM) control circuit, a conversion circuit, and an output processing circuit. The input processing circuit is for rectifying an alternating current voltage to be a primary direct current voltage. The PFC/PWM control circuit is for modulating the primary direct current voltage. The PFC/PWM control circuit is assembled on a subsidiary printed circuit board electrically connected to the main printed circuit board. The conversion circuit is for converting the primary direct current voltage to be a secondary direct current voltage. The output processing circuit is for smoothing the secondary direct current voltage.

Other systems, methods, features, and advantages of the present power source module will be or become apparent to one with skill in the art upon examination of the following drawings and detailed description. It is intended that all such additional systems, methods, features, and advantages be included within this description, be within the scope of the present device, and be protected by the accompanying claims.

BRIEF DESCRIPTION OF THE DRAWINGS

Many aspects of the present power source module can be better understood with reference to following drawings. Components in the drawings are not necessarily to scale, emphasis instead being placed upon clearly illustrating the principles of the present device. Moreover, in the drawings, like reference numerals designate corresponding parts throughout the several views.

DETAILED DESCRIPTION OF THE INVENTION

Reference will now be made to the drawings to describe a preferred embodiment of the present power source module.

Figure 1:
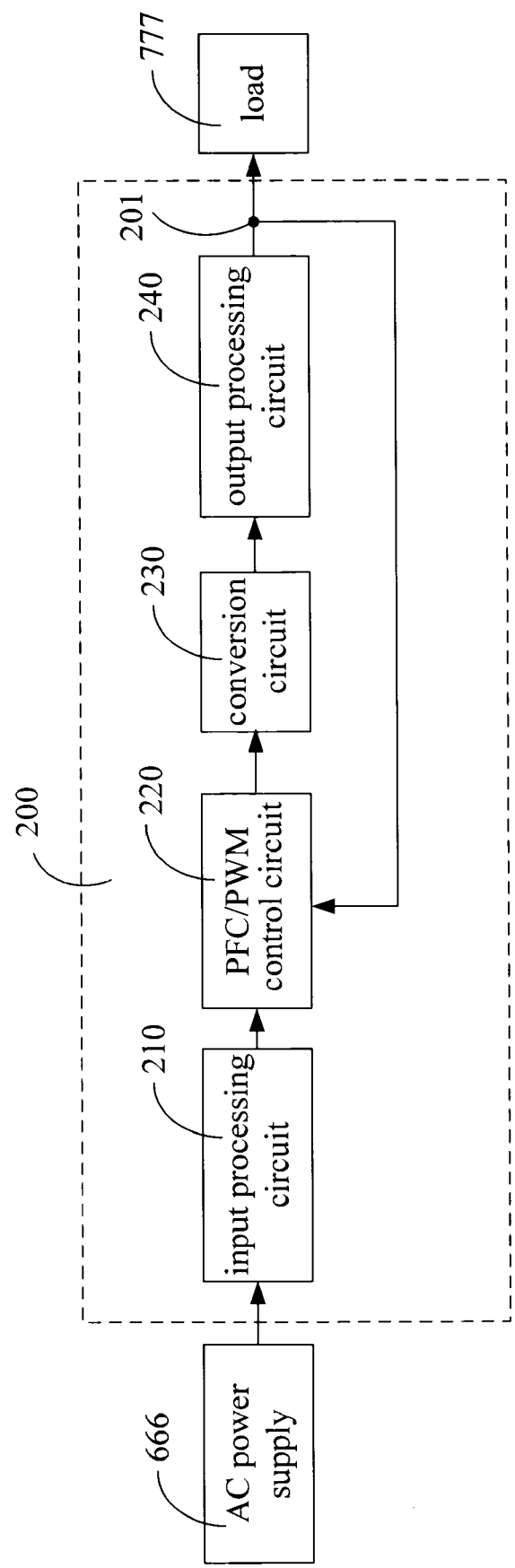
FIG. 1 is a block diagram showing a power source module in accordance with an exemplary embodiment.

Referring to FIG. 1, a power source module 200 connects an alternating current (AC) power supply 666 to a load 777. The power source module 200 includes an input processing circuit 210, a power factor correction/pulse width modulation (PFC/PWM) control circuit 220, a conversion circuit 230, and an output processing circuit 240 electrically connected in series. The PFC/PWM control circuit 220 is electrically connected to an interconnection 201 between the output processing circuit 240 and the load 777.

The input processing circuit 210 rectifies an alternating current (AC) voltage received and outputs a primary direct current (DC) voltage to the PFC/PWM control circuit 220. The PFC/PWM control circuit 220 modulates the primary DC voltage and sends the modulated DC voltage to the conversion circuit 230. The conversion circuit 230 converts the modulated DC voltage to a secondary DC voltage and sends the secondary DC voltage to the output processing circuit 240. The output processing circuit 240 smoothes the secondary DC voltage and sends a smoothed voltage to the load 777. The smoothed voltage is also fed back to the 220.

Figure 2:
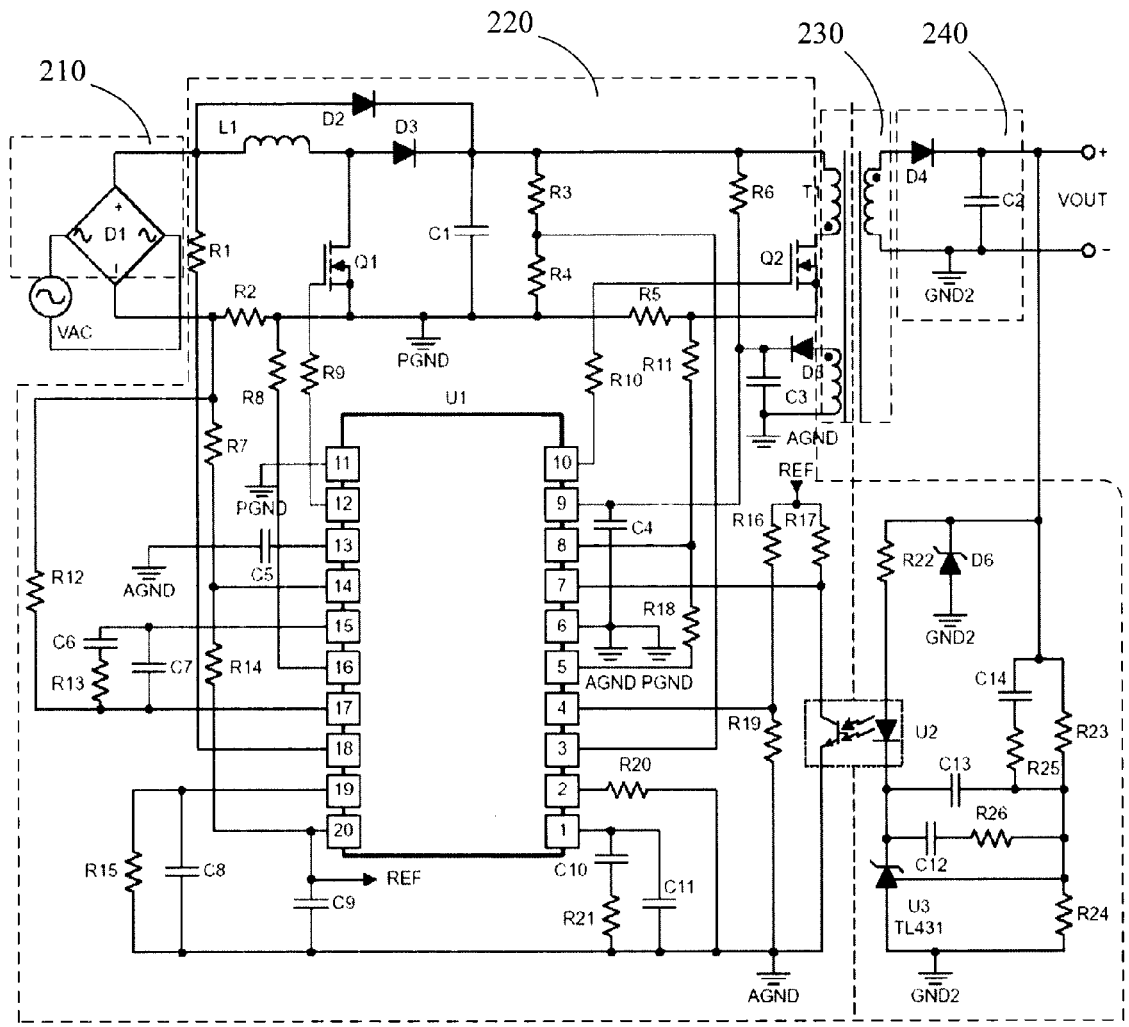
FIG. 2 is a schematic diagram showing a concrete structure of the power source module of FIG. 1.

Referring to FIG. 2, the input processing circuit 210 includes a rectifier D1 for rectifying the AC voltage to generate the primary DC voltage. The PFC/PWM control circuit 220 includes a first metal-oxide semiconductor field-effect transistor (MOSFET) Q1, a second MOSFET Q2, and a chip U1. The first MOSFET Q1 is controlled by the chip U1 to modulate a frequency of the primary DC voltage. The second MOSFET Q2 is controlled by the chip U1 to modulate pulse widths of the primary DC voltage. The conversion circuit 230 includes a converter T1 for modulating amplitude of the primary DC voltage and converting the primary DC voltage to a secondary DC voltage. The output processing circuit 240 includes a diode D4 for rectifying the secondary DC voltage, and a capacitor C2 for filtering the secondary DC voltage.

In the power source module 200, electro magnetic interference (EMI) exists among the circuits, thus, the chip U1 may be affected by electromagnetic waves emitted.

Figure 3:
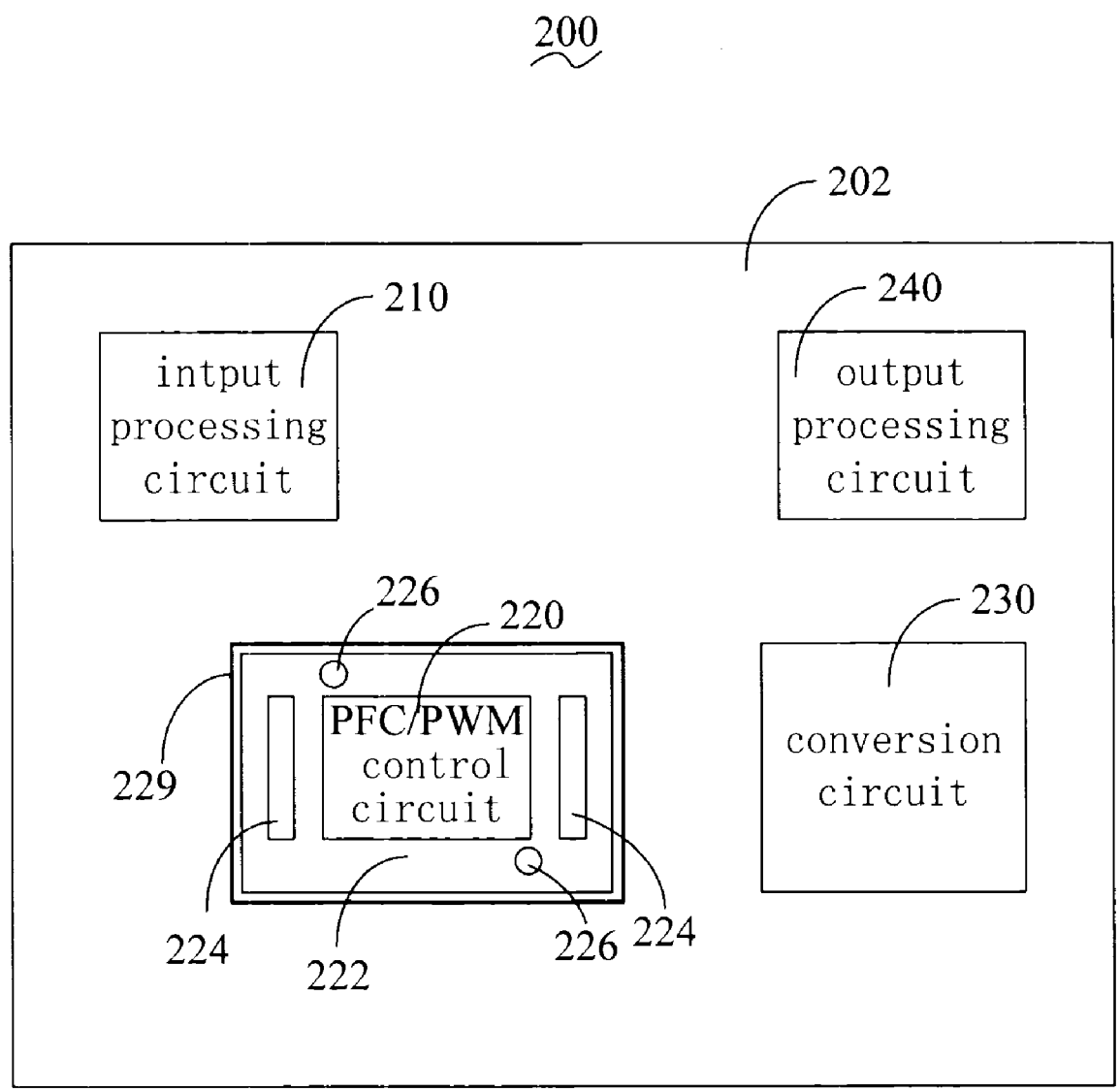
FIG. 3 is a schematic diagram of a layout of the power source module of FIG. 1.

In order to reduce the EMI, the PFC/PWM control circuit 220 is configured separately from the other circuits. Referring to FIG. 3, a subsidiary printed circuit board (PCB) 222 is mounted on a main PCB 202, and the subsidiary PCB 222 includes two connectors 224 both electrically connecting the subsidiary PCB 222 to the main PCB 202. The PFC/PWM control circuit 220 is assembled on the subsidiary PCB 222, and a metal shield 229 is used to cover the PFC/PWM control circuit 220 to protect the PFC/PWM control circuit 220 from the EMI. Furthermore, the subsidiary PCB 222 also includes two guiding holes 226 allowing air flow, so as to improve heat dissipation of the subsidiary PCB 222.

Figure 4:
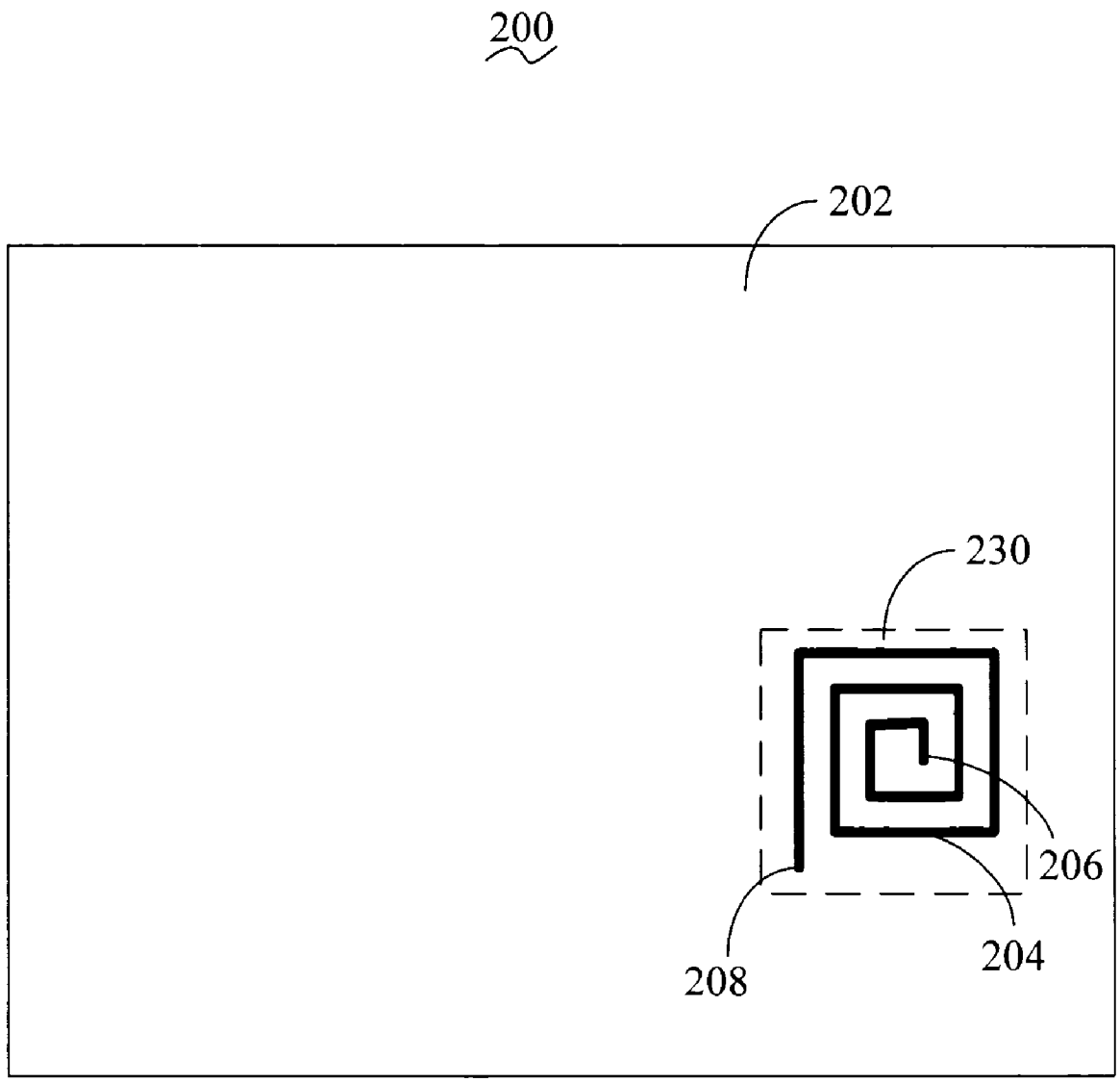
FIG. 4 is a schematic diagram of a layout of a microstrip antenna of the power source module of FIG. 1.
Figure 5:
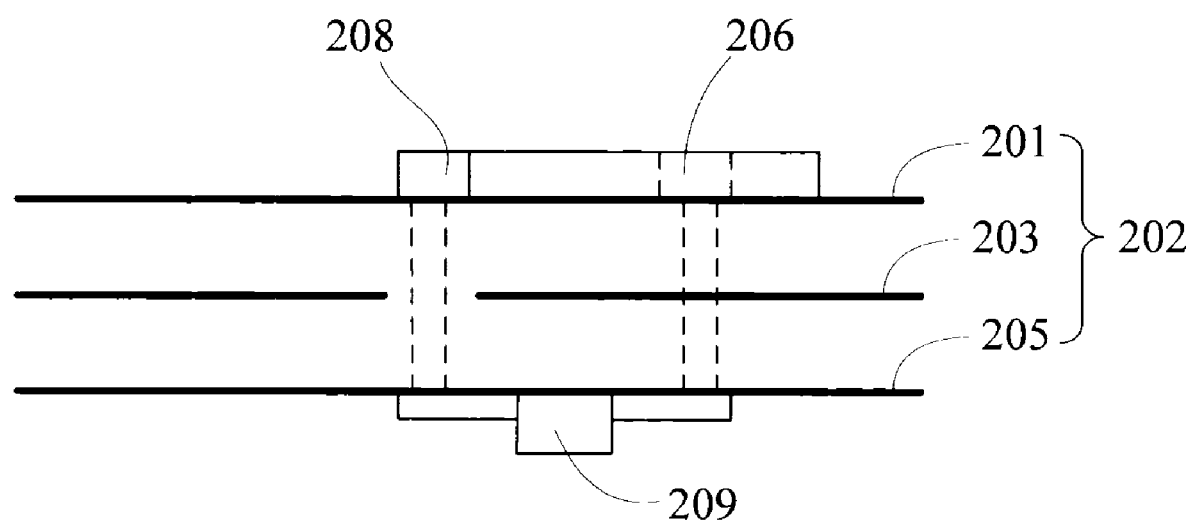
FIG. 5 is a schematic diagram of the layout of the microstrip antenna of FIG. 4 in a side view.
Figure 6:
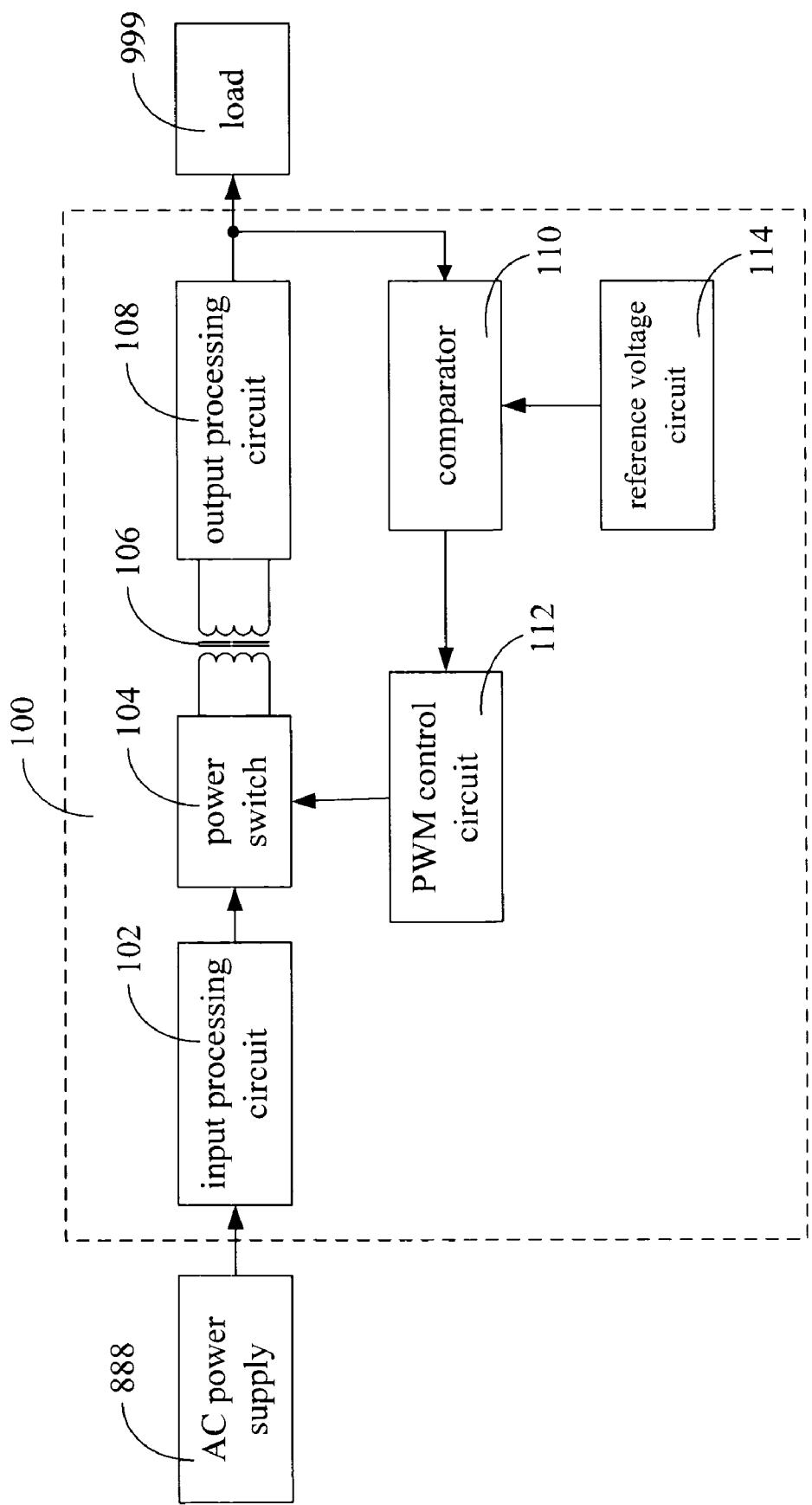
FIG. 6 is a schematic diagram showing a conventional power source module.

Referring to FIGS. 4 and 5, a microstrip antenna 204 is formed on the main PCB 202. The microstrip antenna 204 is disposed under the conversion circuit 230 for absorbing and shielding electromagnetic waves emitted from the conversion circuit 230.

The main PCB 202 includes three layers 201, 203, 205. The layer 203 is a grounded layer formed between the layer 201 and the layer 205. The microstrip antenna 204 is formed on the layer 201. The microstrip antenna 204 is a metal strip with a shape of spiral. An adjustable capacitor 209 is formed on the layer 205. An inner terminal 206 of the microstrip antenna 204 is electrically connected to the layer 203 of the main PCB 202, and one end of the adjustable capacitor 209. An outer terminal 208 of the microstrip antenna 204 is electrically connected to another end of the adjustable capacitor 209. When the electromagnetic waves are emitted from the conversion circuit 230, the adjustable capacitor 209 is adjusted according to frequencies of the electromagnetic waves. The electromagnetic waves are received by the outer terminal 208, sent to the inner terminal 206 and conducted to the grounded layer 203.

The PFC/PWM control circuit 220 is assembled on the subsidiary PCB 222, and the subsidiary PCB 222 can be assembled on an appropriate place with less electromagnetic waves in the main PCB 202. In addition, the metal shield 229 protects the PFC/PWM control circuit 220 against electromagnetic waves. Furthermore, the microstrip antenna 204 is formed under the conversion circuit 230, and electromagnetic waves emitted from the conversion circuit 230 can be absorbed by the microstrip antenna 204.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. A power source module assembled on a main printed circuit board, the power source module comprising:
   an input processing circuit for rectifying an alternating current voltage to be a primary direct current voltage;
   a PFC/PWM control circuit for modulating the primary direct current voltage, the PFC/PWM control circuit assembled on a subsidiary printed circuit board electrically connected to the main printed circuit board, and the subsidiary printed circuit board comprising a metal shield covering the PFC/PWM control circuit;
   a conversion circuit for converting the primary direct current voltage to be a secondary direct current voltage; and
   an output processing circuit for rectifying and filtering the secondary direct current voltage.

2. The power source module according to claim 1, wherein the subsidiary printed circuit board comprises two connectors electrically connecting the subsidiary printed circuit board to the main printed circuit board.

3. The power source module according to claim 2, wherein the subsidiary printed circuit board comprises two guiding holes for leading air flowing therethrough.

4. The power source module according to claim 1, further comprising a microstrip antenna formed under the conversion circuit in the main printed circuit board.

5. The power source module according to claim 4, wherein the microstrip antenna is a metal strip with a shape of spiral.

6. The power source module according to claim 4, wherein the microstrip antenna comprises an inner terminal connected to ground, and an outer terminal for receiving electromagnetic waves emitted from the conversion circuit.

7. The power source module according to claim 6, further comprising an adjustable capacitor electrically connected between the inner terminal and the outer terminal of the microstrip.

8. A power source module assembled on a main printed circuit board, the power source module comprising:
   an input processing circuit for rectifying an alternating current voltage to be a primary direct current voltage;
   a PFC/PWM control circuit for modulating the primary direct current voltage;
   a conversion circuit for converting the primary direct current voltage to be a secondary direct current voltage;
   a microstrip antenna formed under the conversion circuit in the main printed circuit boards the microstrip antenna being separate from the conversion circuit; and
   an output processing circuit for rectifying and filtering the secondary direct current voltage.

9. The power source module according to claim 8, wherein the microstrip antenna is a metal strip with a shape of spiral.

10. The power source module according to claim 8, wherein the microstrip antenna comprises an inner terminal connected to ground, and an outer terminal for receiving electromagnetic waves emitted from the conversion circuit.

11. The power source module according to claim 10, further comprising an adjustable capacitor electrically connected between the inner terminal and the outer terminal of the microstrip.

12. The power source module according to claim 8, wherein the PFC/PWM control circuit is assembled on a subsidiary printed circuit board electrically connected to the main printed circuit board.

13. The power source module according to claim 12, wherein the subsidiary printed circuit board comprises two connectors electrically connecting the subsidiary printed circuit board to the main printed circuit board.

14. The power source module according to claim 13, wherein the subsidiary printed circuit board comprises a metal shield for covering the PFC/PWM control circuit.

15. The power source module according to claim 4, wherein the microstrip antenna is separate from the conversion circuit.

16. The power source module according to claim 12, wherein the subsidiary printed circuit board comprises two guiding holes for dissipating heat generated from the PFC/PWM control circuit.

* * * * *